United States Patent
Bekele et al.

(10) Patent No.: US 10,630,301 B1
(45) Date of Patent: Apr. 21, 2020

(54) TEMPERATURE-DEPENDENT PHASE-LOCKED LOOP (PLL) RESET FOR CLOCK SYNTHESIZERS

(71) Applicant: Xilinx, Inc., San Jose, CA (US)

(72) Inventors: Adebabay M. Bekele, San Jose, CA (US); Parag Upadhyaya, Los Gatos, CA (US); Didem Z. Turker Melek, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/192,098

(22) Filed: Nov. 15, 2018

(51) Int. Cl.
  *H03L 7/10* (2006.01)
  *H03L 7/099* (2006.01)
  *H03L 7/089* (2006.01)
  *H03L 7/18* (2006.01)

(52) U.S. Cl.
  CPC ............ *H03L 7/099* (2013.01); *H03L 7/0895* (2013.01); *H03L 7/10* (2013.01); *H03L 7/18* (2013.01)

(58) Field of Classification Search
  CPC ... H03L 7/099; H03L 7/10; H03L 7/18; H03L 7/0895; H03L 2207/06; H03L 7/187; H03B 5/124; H03B 5/1293; H03J 3/185; H03J 2200/15; H03J 2200/37; H03J 7/00
  See application file for complete search history.

(56) References Cited

U.S. PATENT DOCUMENTS

| | | |
|---|---|---|
| 6,542,040 B1 | 4/2003 | Lesea |
| 7,148,758 B1 | 12/2006 | Ross et al. |
| 7,499,513 B1 | 3/2009 | Tetzlaff et al. |
| 7,504,891 B1 | 3/2009 | Liu |
| 7,764,129 B1 | 7/2010 | Wong et al. |
| 8,120,430 B1 | 2/2012 | Vasudevan |
| 8,717,115 B2 | 5/2014 | Upadhyaya |
| 8,841,948 B1 | 9/2014 | Chien et al. |
| 9,608,644 B1 | 3/2017 | Raj et al. |
| 9,742,380 B1 | 8/2017 | Raj et al. |
| 2005/0231297 A1* | 10/2005 | Aparin ............... H03L 1/023 331/177 V |

* cited by examiner

*Primary Examiner* — Rahel Guarino
(74) *Attorney, Agent, or Firm* — Paradice and Li LLP

(57) ABSTRACT

A voltage-controlled oscillator (VCO) includes an inductor-capacitor (LC) tank circuit, tuning circuitry, and a plurality of first varactors. The LC tank circuit is configured to produce an oscillating signal and is operable in a plurality of frequency bands. The tuning circuitry is configured to tune the LC tank circuit to operate in a first frequency band of the plurality of frequency bands based at least in part on a temperature of the VCO. The plurality of first varactors are coupled to the LC tank circuit for tuning the oscillating signal to a target frequency within the first frequency band based on a control voltage.

20 Claims, 9 Drawing Sheets

TEMPERATURE-DEPENDENT PHASE-LOCKED LOOP (PLL) RESET FOR CLOCK SYNTHESIZERS

TECHNICAL FIELD

Aspects of the present disclosure generally relate to integrated circuits, and specifically to temperature-aware phase-locked loop (PLL) circuits.

BACKGROUND

Clock synthesizers, which are often implemented as phase-locked loop (PLL) circuits, may be used to generate high-frequency signals based on a lower frequency reference signal. Many PLLs include a voltage-controlled oscillator (VCO) to generate an output signal at the desired frequency. For example, a VCO generates an oscillating signal having a frequency of oscillation that is controlled by a voltage provided to the VCO (e.g., a control voltage). However, changes in temperature and other variations in the operating conditions of the VCO and/or PLL may cause variations in the frequency of the output signal. Thus, the control voltage may be adjusted to compensate for changes in operating conditions.

Inductor-capacitor (LC) VCOs tend to be especially sensitive to process, voltage, and temperature (PVT) variations. Such variations in process and voltage are typically compensated for when selecting a particular carrier frequency for a given application. However, the temperature of the PLL and/or VCO may continually change over time. Changes in temperature may affect the ability of the VCO to maintain the output signal at the desired frequency of oscillation. For example, a significant change in temperature may require an equally significant change in the control voltage of the VCO to maintain the output signal at the desired frequency. If the change in control voltage should exceed the dynamic range of the PLL (or VCO), the VCO may need to be reset. Resetting the VCO may cause the PLL to break lock.

Thus, it is desirable to compensate for changes in operating conditions (e.g., temperature) of the VCO while ensuring that the control voltage remains within the dynamic range of the VCO.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to voltage-controlled oscillators (VCOs) and methods of their operation. An example VCO circuit may include an inductor-capacitor (LC) tank circuit, tuning circuitry, and a plurality of first varactors. The LC tank circuit is configured to produce an oscillating signal and is operable in a plurality of frequency bands. The tuning circuitry is configured to tune the LC tank circuit to operate in a first frequency band of the plurality of frequency bands based at least in part on a temperature of the VCO circuit. The plurality of first varactors are coupled to the LC tank circuit for tuning the oscillating signal to a target frequency within the first frequency band based on a control voltage.

The LC tank circuit may comprise an inductor coupled between a first output of the VCO circuit and a second output of the VCO circuit, and a number of capacitors switchably coupled between the first and second outputs of the VCO circuit. For example, the frequency band of the LC tank circuit may depend on the number of capacitors coupled between the first and second outputs of the VCO circuit.

In some embodiments, the tuning circuitry may comprise a temperature sensor to measure the temperature of the VCO circuit and a voltage reset controller to select a reset value for the control voltage based on the temperature of the VCO circuit. For example, the control voltage may be initialized to the reset value when starting or restarting the VCO circuit. The tuning circuitry may further include coarse tuning circuitry to select the first frequency band based at least in part on the reset value of the control voltage and the target frequency of the oscillating signal.

The frequency of the oscillating signal may be different than the target frequency when the LC tank circuit operates in the first frequency band and the control voltage is at the reset value. Thus, in some aspects, the VCO circuit may further include fine tuning circuitry coupled to the plurality of first varactors and configured to tune the oscillating signal to the target frequency by increasing or decreasing the control voltage from the reset value.

In some aspects, the voltage reset controller may comprise a temperature comparator and a codeword generator. The temperature comparator may compare the temperature of the VCO circuit with a plurality of temperature thresholds and select one of a plurality of temperature windows based on the comparison. The codeword generator may select one of a plurality of voltage codewords based on the selected temperature window. For example, the selected voltage codeword may correspond to the reset value for the control voltage. In some embodiments, the VCO circuit may further include a digital-to-analog converter (DAC) to convert the selected voltage codeword to the control voltage.

In some embodiments, the VCO circuit may further comprise a plurality of second varactors, coupled to the LC tank circuit, for adjusting a frequency of the oscillating signal in response to change in the temperature of the VCO circuit.

An example method disclosed herein may be used to operate a VCO circuit. The method may include generating an oscillating signal using an LC tank circuit, wherein the LC tank circuit is operable in a plurality of frequency bands; tuning the LC tank circuit to operate in a first frequency band of the plurality of frequency bands based at least in part on a temperature of the VCO circuit; and tuning the oscillating signal to a target frequency within the first frequency band by applying a control voltage to a plurality of first varactors coupled to the LC tank circuit.

In some embodiments, the step of tuning the LC tank circuit may include steps of measuring a temperature of the VCO circuit, selecting a reset value for the control voltage based on the temperature of the VCO circuit, and selecting the first frequency band based at least in part on the reset value of the control voltage and the target frequency of the oscillating signal. For example, the control voltage is initialized to the reset value when starting or restarting the VCO circuit.

In some aspects, a frequency of the oscillating signal may be different than the target frequency when the LC tank circuit operates in the first frequency band and the control voltage is at the reset value. Thus, the oscillating signal may be tuned to the target frequency by increasing or decreasing the control voltage from the reset value.

In some aspects, the step of selecting the reset value may further include steps of comparing the temperature of the VCO circuit with a plurality of temperature thresholds, selecting one of a plurality of temperature windows based on the comparison, selecting one of a plurality of voltage codewords based on the selected temperature window, and converting the selected voltage codeword to the control voltage.

In some embodiments, the method may further include a step of adjusting a frequency of the oscillating signal, using a plurality of second varactors, in response to changes in the temperature of the VCO circuit.

Another example VCO circuit may include an LC tank circuit, tuning circuitry, and a plurality of first varactors. The LC tank circuit is configured to produce an oscillating signal and is operable in a plurality of frequency bands. The plurality of first varactors are coupled to the LC tank circuit for tuning the oscillating signal to a target frequency based on a control voltage. The tuning circuitry is configured to select a reset value for the control voltage based on a temperature of the VCO circuit. For example, the control voltage may be initialized to the reset value when starting or restarting the VCO circuit.

In some embodiments, the VCO circuit may further comprise a temperature sensor to measure the temperature of the VCO circuit and coarse tuning circuitry to tune the LC tank circuit to operate in a first frequency band of the plurality of frequency bands based at least in part on the reset value of the control voltage and the target frequency of the oscillating signal. In some aspects, a frequency of the oscillating signal may be different than the target frequency when the LC tank circuit operates in the first frequency band and the control voltage is at the reset value. Thus, the VCO circuit may further include fine tuning circuitry coupled to the plurality of first varactors and configured to tune the oscillating signal to the target frequency by increasing or decreasing the control voltage from the reset value.

In some aspects, the tuning circuitry may comprise a temperature comparator and a codeword generator. The temperature comparator may compare the temperature of the VCO circuit with a plurality of temperature thresholds and select one of a plurality of temperature windows based on the comparison. The codeword generator may select one of a plurality of voltage codewords based on the selected temperature window. More specifically, the selected voltage codeword may correspond to the reset value for the control voltage. In embodiments, the VCO circuit may further include a DAC to convert the selected voltage codeword to the control voltage.

In some embodiments, the VCO circuit may further comprise a plurality of second varactors, coupled to the LC tank circuit, for adjusting a frequency of the oscillating signal in response to changes in the temperature of the VCO circuit.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
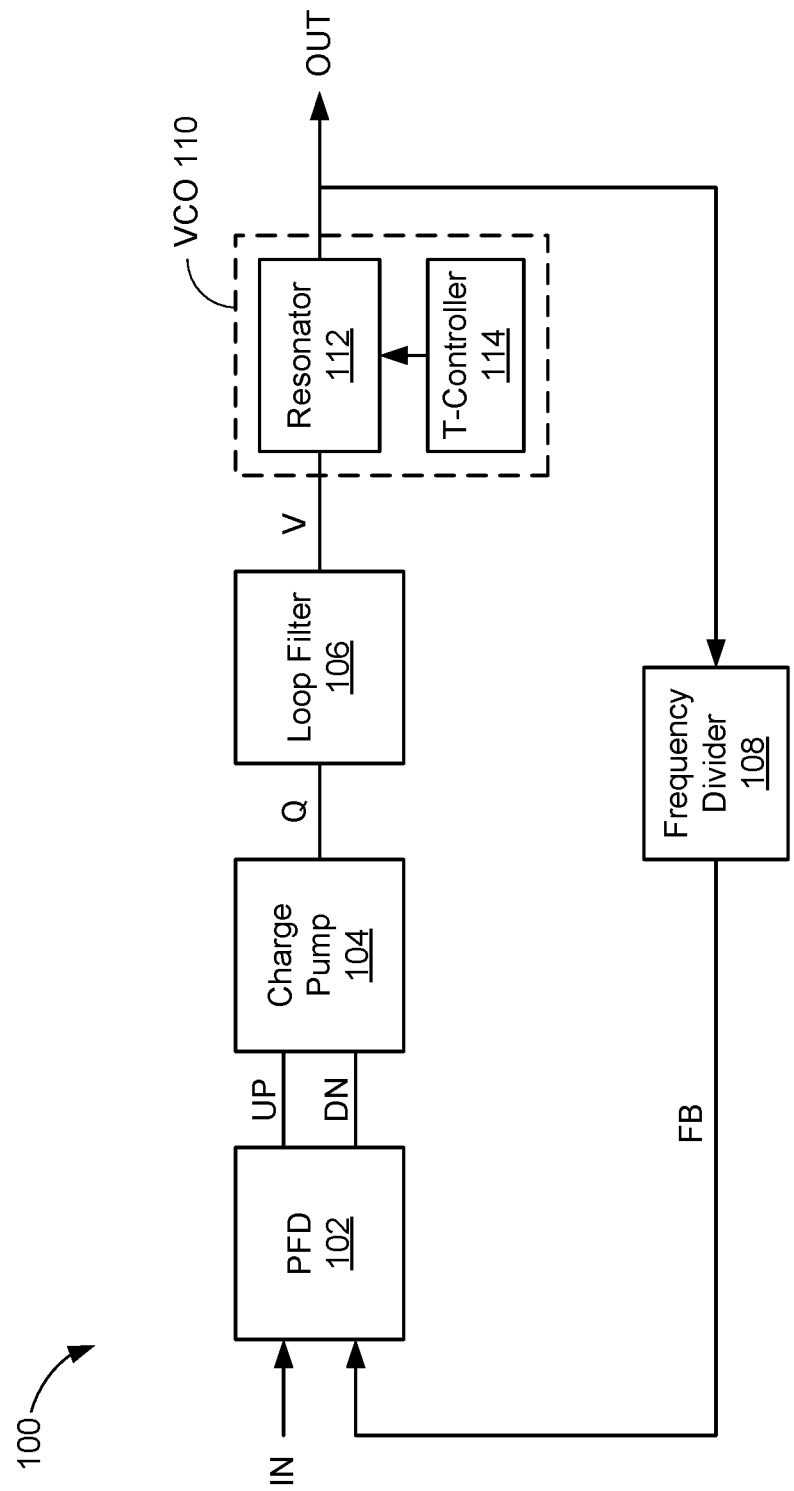
FIG. 1 is a block diagram of a phase-locked loop (PLL) circuit, in accordance with some embodiments.

FIG. 1 is a block diagram of a phase-locked loop (PLL) circuit 100, in accordance with some embodiments. The PLL circuit 100 receives an input signal (IN) and produces an output signal (OUT) based at least in part on the input signal. In some embodiments, the input signal and output signal may be oscillating signals that are locked in phase with one another. However, the frequency of oscillation of the output signal may be different than the frequency of oscillation of the input signal. In some aspects, the output signal may have a higher frequency of oscillation than the input signal.

The PLL circuit 100 includes a phase and frequency detector (PFD) 102, a charge pump 104, a loop filter 106, a frequency divider 108, and a voltage-controlled oscillator (VCO) 110. The PFD 102 compares the phases of the input signal with a feedback signal (FB) to generate "up" (UP) and "down" (DN) control signals. The charge pump 104 converts the UP and DN control signals to a charge (Q) that is proportional to the phase difference of signals X and FB. The charge Q is filtered (e.g., integrated) by the loop filter 106 and provided as a control voltage (V) to the VCO 110. The VCO 110 includes a resonant circuit 112 that produces an output signal having a frequency of oscillation based on the control voltage V. The output signal is provided to the frequency divider 108 (e.g., to scale the frequency of the output signal to that of the input signal) and fed back to the PFD 102 as the feedback signal.

As described above, changes in temperature and other variations in the operating conditions of the VCO 110 and/or PLL 100 may cause variations in the frequency of the output signal. The PLL 100 may respond to such changes in temperature and/or operating conditions by adjusting the control voltage V provided to the VCO 110 to maintain the output signal at the desired frequency of oscillation. However, the amount of temperature variation that can be compensated may be limited by the dynamic voltage range of the PLL 100 (or the VCO 110). For example, a significant change in temperature may require an equally significant change in the control voltage V for the VCO 110 to maintain the output signal at the desired frequency. If the change in control voltage exceeds the dynamic range of the PLL 100, the VCO 110 may need to be reset (e.g., to change frequency bands). Resetting the VCO 110 may cause the PLL 100 to break lock.

In some embodiments, the VCO 110 may further include a temperature-dependent controller (T-Controller) 114 to measure a temperature of the PLL 100 and/or the VCO 110. More specifically, the temperature measurement may be used to control an operation of the VCO 110. For example, in some aspects, the controller 114 may determine a reset value for the control voltage of the VCO 110 based on the temperature of the PLL 100 and/or the VCO 110. The control voltage may be initialized to the reset value each time the VCO 110 is started or restarted. As described in greater detail below, the reset value may affect the selection of a frequency band in which the VCO 110 is configured to operate. Proper frequency band selection may ensure that the maximum dynamic range of the PLL 100 is available for adjusting the control voltage (e.g., without resetting the VCO 110). In some other aspects, the controller 114 may fine-tune a frequency of the VCO 110, in response to temperature variations, to maintain the output signal at a target frequency (e.g., after the VCO 110 has been initialized).

Figure 2:
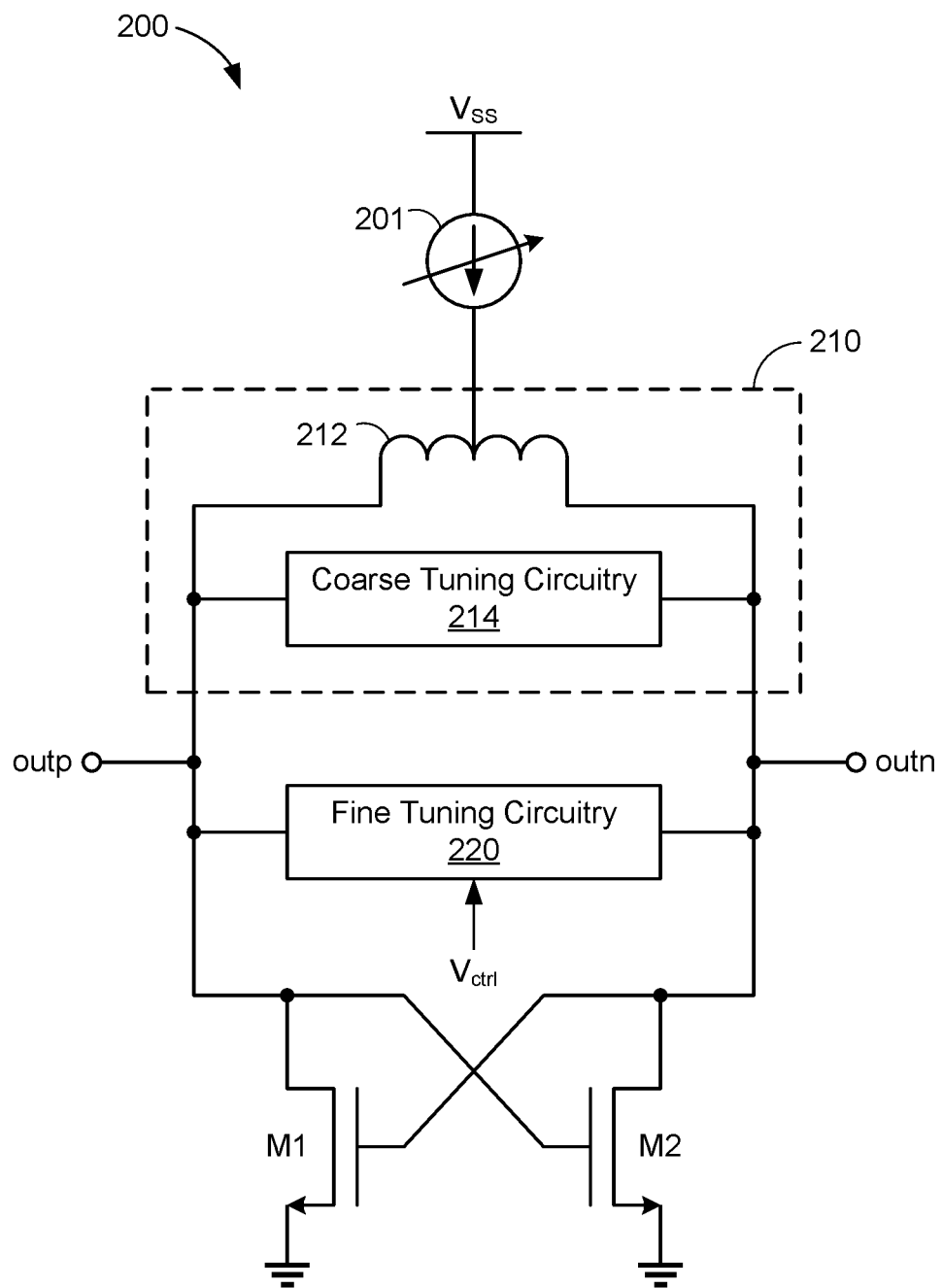
FIG. 2 is a block diagram of a voltage-controlled oscillator (VCO) circuit, in accordance with some embodiments.

FIG. 2 is a block diagram of a temperature-dependent VCO circuit 200, in accordance with some embodiments. The VCO circuit 200 may be an example embodiment of the VCO 110 of FIG. 1. Thus, the VCO circuit 200 may be configured to produce an oscillating signal having a frequency of oscillation that is determined by a control voltage $V_{ctrl}$. In the example of FIG. 2, the oscillating signal may be output (e.g., as a differential signal) at a pair of output terminals (outp and outn) of the VCO circuit 200. In some embodiments, the VCO circuit 200 may include a current source 201, an inductor-capacitor (LC) tank 210, and fine-tuning circuitry 220. In the example of FIG. 2, a pair of cross-coupled transistors M1 and M2 are also coupled to the outputs outp and outn of the VCO circuit 200 and provide a path to ground.

The LC tank 210 includes an inductor 212 and coarse-tuning circuitry 214. In the example of FIG. 2, the inductor 212 is coupled between the outputs outp and outn of the VCO circuit 200. The coarse-tuning circuitry 214 may include a plurality of capacitors (not shown for simplicity) that are switchably coupled to the outputs outp and outn of the VCO circuit 200. In some aspects, the plurality of capacitors may be arranged in rows and columns, forming an array. Specifically, each row of the array may include a pair of capacitors switchably coupled between the outputs outp and outn of the VCO circuit 200. The number of capacitors (of the coarse-tuning circuitry 214) coupled to the outputs outp and outn of the VCO circuit 200 may determine the frequency band of the VCO circuit 200. Thus, the coarse-tuning circuitry 214 may tune the VCO circuit 200 to operate in one of a plurality of frequency bands by selectively coupling or decoupling one or more rows of capacitors to the outputs outp and outn of the VCO circuit 200.

The frequency of the output signal depends on the effective inductance (L) and the effective capacitance (C) of the VCO circuit 200 (e.g., between the outputs outp and outn). As described above, the LC tank 210 may produce an oscillating signal that can be coarsely tuned to have a frequency of oscillation in one of a plurality of frequency bands. However, once the LC tank 210 has been configured to operate in a selected frequency band (e.g., using the coarse-tuning circuitry 214), the frequency of the output signal may be tuned (e.g., within a range of frequencies associated with the selected frequency band) using the fine-tuning circuitry 220. In some embodiments, the fine-tuning circuitry 220 may include one or more varactors coupled (e.g., in series) between the outputs outp and outn of the VCO circuit 200. A capacitance of at least some of the varactors may be controlled by a control voltage $V_{ctrl}$. Thus, the control voltage $V_{ctrl}$ may be used to fine-tune the frequency of oscillation of the output signal to compensate for variations in temperature and/or other operating conditions of the VCO circuit 200.

Aspects of the present disclosure recognize that the selection of a frequency band for the VCO circuit 200 may depend on the desired frequency of oscillation (e.g., for the output signal) and the control voltage $V_{ctrl}$. Specifically, because the frequency band is selected before control of the VCO circuit 200 is passed to the PLL (e.g., before the PLL provides the control voltage $V_{ctrl}$ to the VCO circuit 200), the selection of the frequency band may depend on the reset value of the control voltage $V_{ctrl}$. The reset value may correspond to the voltage level to which the control voltage $V_{ctrl}$ is initialized each time the VCO circuit 200 is started or restarted. When bringing up the VCO circuit 200, the coarse-tuning circuitry 214 may select the frequency band that is closest to the target (or desired) frequency of the output signal given the initial state (e.g., reset value) of the control voltage $V_{ctrl}$. In some aspects, when the target frequency is between two frequency bands, the coarse-tuning circuitry 214 may select the higher of the two frequency bands (e.g., producing higher frequencies of oscillation at any control voltage $V_{ctrl}$).

As described above, changes in temperature of the VCO circuit 200 and/or the PLL may cause changes in the oscillation frequency of the output signal. Although the control voltage $V_{ctrl}$ can be adjusted to compensate for a limited range of frequency variations, more significant changes in frequency (e.g., due to thermal drift) may require changing the frequency band of the VCO circuit 200. However, changing the frequency band may require a reset of the VCO circuit 200 (e.g., to change the number of capacitors, in the coarse-tuning circuitry 214, coupled to the outputs outp and outn). Resetting the VCO circuit 200 may cause the corresponding PLL to break lock, which may result in a failure of the underlying application. For example, when the PLL is used for data communications (e.g., in a serializer/de-serializer application), resetting the VCO circuit 200 may cause a break in the communications link. Since the frequency band of the LC tank 210 may affect the performance of the VCO circuit 200 (specifically, the ability of the VCO circuit 200 to compensate for thermal drift), it is desirable to select an appropriate frequency band given the temperature of the VCO circuit 200 (or the PLL).

In some embodiments, the fine-tuning circuitry 220 may select a reset value for the control voltage $V_{ctrl}$ based, at least in part, on the temperature of the VCO circuit 200 and/or the PLL in which the VCO circuit 200 operates. For example, the fine-tuning circuitry 220 may select a higher (or lower) reset value for the control voltage $V_{ctrl}$ when the VCO circuit 200 is brought up (e.g., started or restarted) in hotter temperatures, and may select a lower (or higher) reset value for the control voltage $V_{ctrl}$ when the VCO circuit 200 is brought up in colder temperatures. By adjusting the reset value for the control voltage $V_{ctrl}$ based on the temperature of the VCO circuit 200, the coarse-tuning circuitry 214 may also select a frequency band (e.g., by coupling or de-coupling capacitors between the outputs outp and outn) for the VCO circuit 200 that is well-suited for current (and future) temperature conditions.

Figure 3:
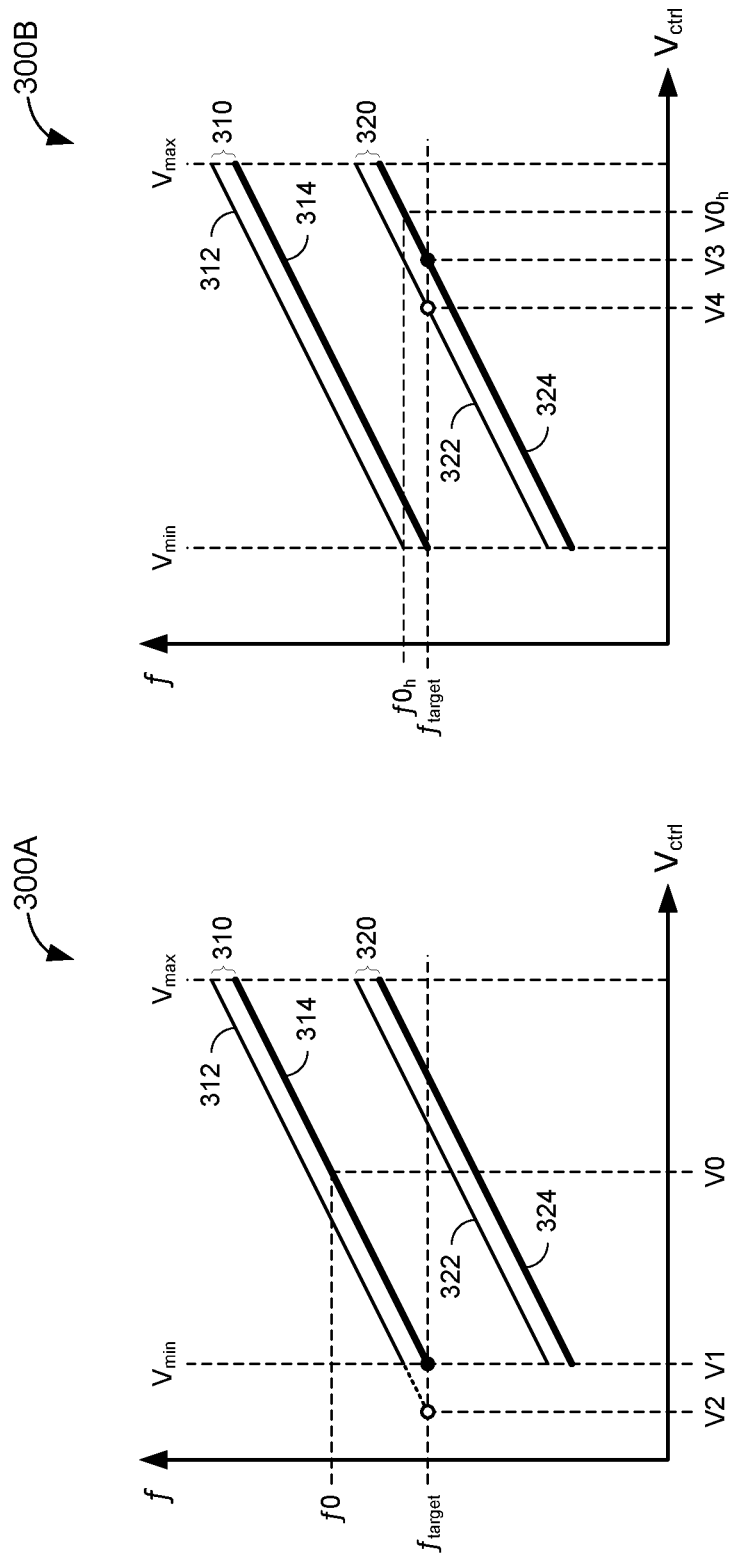
FIGS. 3A and 3B are frequency diagrams depicting example processes for tuning the frequency of a VCO brought up under hot temperature conditions.

FIGS. 3A and 3B are frequency diagrams 300A and 300B, respectively, depicting example processes for tuning the frequency of a VCO (such as the VCO circuit 200 of FIG. 2) brought up under hot temperature conditions. Each of the frequency diagrams 300A and 300B shows a plot of the frequency of oscillation (f) relative to the control voltage ($V_{ctrl}$) of the VCO. More specifically, the frequency diagrams 300A and 300B depict a set of frequency bands 310 and 320 within which the VCO may be configured to operate.

The VCO may support temperature variations within a limited range of temperatures. Thus, each of the frequency bands 310 and 320 may also span a range of frequencies (e.g., corresponding to temperature variations) for any given control voltage $V_{ctrl}$. In the examples of FIGS. 3A and 3B, the upper frequency band 310 is bounded by a relatively thin curve 312 and a relatively thick curve 314 and the lower frequency band 320 is bounded by a relatively thin curve 322 and a relatively thick curve 324. In some aspects, the thin curves 312 and 322 may represent the frequency curves associated with the coldest temperatures supported by the VCO (e.g., for the given frequency band), whereas the thick curves 314 and 324 may represent the frequency curves associated with the hottest temperatures supported by the VCO (e.g., for the given frequency band).

In the examples of FIGS. 3A and 3B, the VCO is brought up (e.g., started or restarted) under the hottest supported temperature conditions. With reference for example to FIG. 2, when bringing up the VCO circuit 200, the coarse-tuning circuitry 214 may select one of the frequency bands 310 or 320 based on a reset value of the control voltage $V_{ctrl}$. As described above, the frequency band selection may affect the ability of the VCO to compensate for changes in frequency due to thermal drift. With reference for example to FIG. 3A, when the control voltage $V_{ctrl}$ is initialized to a reset voltage V0, the target frequency $f_{target}$ is between the frequency bands 310 and 320 (e.g., at V0). Thus, in some aspects, the coarse-tuning circuitry 214 may select the higher frequency band 310 to coarse-tune the VCO circuit 200. Specifically, the coarse-tuning circuitry 214 may configure the VCO circuit 200 to operate in the higher frequency band 310 by coupling (or de-coupling) a number of capacitors (e.g., of the capacitor array) to the outputs outp and outn of the VCO circuit 200.

Because the VCO circuit 200 is brought up under hot temperature conditions, the VCO circuit 200 will initially produce an output signal at a frequency f0 (e.g., corresponding to the point along the frequency curve 314 while the control voltage is still held at the reset value V0) once coarse-tuning has been completed. However, after the coarse-tuning circuitry 214 has configured the VCO circuit 200 to operate in the selected frequency band 310, the VCO circuit 200 may release the control voltage $V_{ctrl}$ from the reset value V0. For example, the PLL (e.g., PLL 100 of FIG. 1) may assume control of the VCO circuit 200 by adjusting the control voltage $V_{ctrl}$ until the frequency of the output signal reaches the target frequency (target. In the example of FIG. 3A, the output signal reaches the target frequency (target when the control voltage $V_{ctrl}$ is reduced to a first voltage level V1.

It is noted that the first voltage level V1 corresponds to a minimum voltage threshold ($V_{min}$) associated with the PLL. As described above, the dynamic range of the PLL may be bounded by the minimum voltage threshold $V_{min}$ and a maximum voltage threshold $V_{max}$. For example, the PLL may be unable to lower the control voltage $V_{ctrl}$ below the minimum voltage threshold $V_{min}$ or increase the control voltage $V_{ctrl}$ above the maximum voltage threshold $V_{max}$. Thus, if the temperature of the VCO circuit 200 cools down, the PLL may be unable to maintain the output signal at the target frequency $f_{target}$ while operating in the current frequency band 310. For example, if the temperature of the VCO circuit 200 transitions from hot to cold, the control voltage $V_{ctrl}$ would need to be reduced from the first voltage level V1 to a second voltage level V2 under the current frequency band 310 (e.g., from frequency curve 312 to frequency curve 314, as shown in FIG. 3A). However, because the PLL may be unable to adjust the control voltage $V_{ctrl}$ to the second voltage level V2 (since it is below the minimum voltage threshold $V_{min}$), the VCO circuit 200 may need to be reset (e.g., to switch to the lower frequency band 320). As described above, resetting the VCO circuit 200 may have undesirable consequences, such as causing the PLL to break lock.

Thus, in some embodiments, the VCO circuit 200 may determine the reset value for the control voltage $V_{ctrl}$ based, at least in part, on the temperature of the VCO circuit 200 and/or the PLL. For example, the VCO circuit 200 may receive temperature information via temperature sensor provided on the VCO circuit 200 and/or the PLL. In some aspects, the fine-tuning circuitry 220 may select a reset value at which the control voltage $V_{ctrl}$ is to be initialized based on received temperature information. With reference for example to FIG. 3B, the fine-tuning circuitry 220 may select a "hot" reset value $V_{ctrl}$ when the VCO circuit 200 is brought up under hot temperature conditions. As shown in FIG. 3B, the hot reset value $V0_h$ is relatively high (e.g., higher than the reset value V0 depicted in FIG. 3A). When the control voltage $V_{ctrl}$ is initialized to the hot reset voltage $V0_h$, the target frequency $f_{target}$ is below the lower frequency band 320 (e.g., at $V0_h$). Thus, in some aspects, the coarse-tuning circuitry 214 may select the lower frequency band 320 to coarse-tune the VCO circuit 200. Specifically, the coarse-tuning circuitry 214 may configure the VCO circuit 200 to operate in the lower frequency band 320 by coupling (or de-coupling) a number of capacitors (e.g., of the capacitor array) to the outputs outp and outn of the VCO circuit 200.

Because the VCO circuit 200 is brought up under hot temperature conditions, the VCO circuit 200 will initially produce an output signal at a frequency $f0_h$ (e.g., corresponding to the point along the frequency curve 324 while the control voltage is still held at the hot reset value $V0_h$) once coarse-tuning has been completed. However, after the coarse-tuning circuitry 214 has configured the VCO circuit 200 to operate in the selected frequency band 320, the VCO circuit 200 may release the control voltage $V_{ctrl}$ from the reset value $V0_h$. For example, the PLL (e.g., PLL 100 of FIG. 1) may assume control of the VCO circuit 200 by adjusting the control voltage $V_{ctrl}$ until the frequency of the output signal reaches the target frequency (target. In the example of FIG. 3B, the output signal reaches the target frequency (target when the control voltage $V_{ctrl}$ is reduced to a third voltage level V3.

It is noted that the third voltage level V3 is within the dynamic range of the PLL (e.g., $V_{min}$<V3<$V_{max}$). Thus, the maximum dynamic range may be available for the PLL to adjust the control voltage $V_{ctrl}$ to compensate for temperature drift. For example, if the temperature of the VCO circuit 200 subsequently transitions from hot to cold, the control voltage $V_{ctrl}$ would need to be reduced from the third voltage level V3 to a fourth voltage level V4 under the current frequency band 320 (e.g., from frequency curve 322 to frequency curve 324, as shown in FIG. 3B). In the example of FIG. 3B, the fourth voltage level V4 is still above the minimum voltage threshold $V_{min}$. Thus, the PLL may compensate for temperature variations across the entire range of supported temperatures without changing frequency bands and/or resetting the VCO circuit 200.

Figure 4:
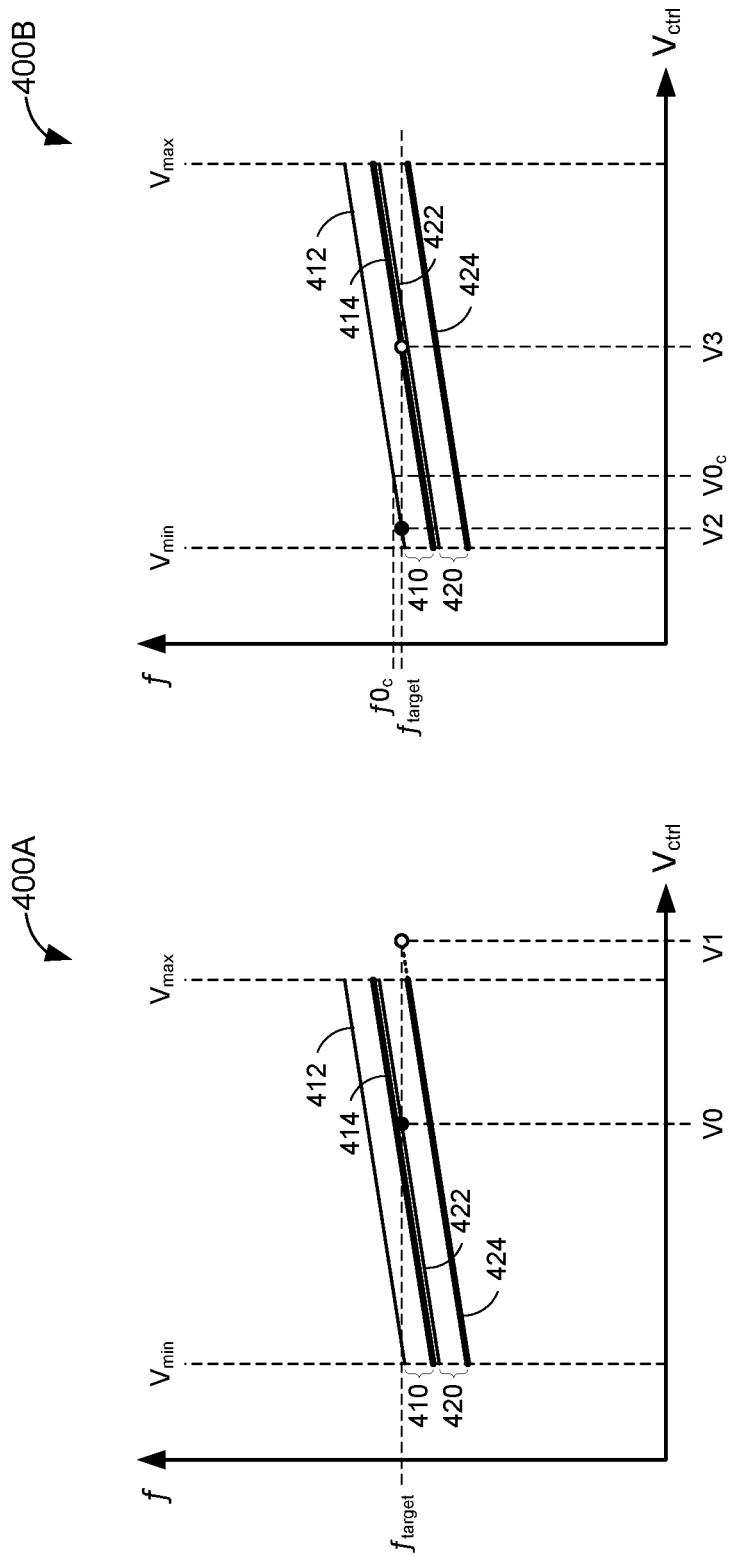
FIGS. 4A and 4B are frequency diagrams depicting example processes for tuning the frequency of a VCO brought up under cold temperature conditions.

FIGS. 4A and 4B are frequency diagrams 400A and 400B, respectively, depicting example processes for tuning the frequency of a VCO (such as the VCO circuit 200 of FIG. 2) brought up under cold temperature conditions. Each of the frequency diagrams 400A and 400B shows a plot of the frequency of oscillation (f) relative to the control voltage ($V_{ctrl}$) of the VCO. More specifically, the frequency diagrams 400A and 400B depict a set of frequency bands 410 and 420 within which the VCO may be configured to operate.

As described above, the VCO may support temperature variations within a limited range of temperatures. Thus, each of the frequency bands 410 and 420 may also span a range of frequencies (e.g., corresponding to temperature variations) for any given control voltage $V_{ctrl}$. In the examples of FIGS. 4A and 4B, the upper frequency band 410 is bounded by a relatively thin curve 412 and a relatively thick curve 414 and the lower frequency band 420 is bounded by a relatively thin curve 422 and a relatively thick curve 424. In some aspects, the thin curves 412 and 422 may represent the frequency curves associated with the coldest temperatures supported by the VCO (e.g., for the given frequency band), whereas the thick curves 414 and 424 may represent the frequency curves associated with the hottest temperatures supported by the VCO (e.g., for the given frequency band).

In the examples of FIGS. 4A and 4B, the VCO is brought up (e.g., started or restarted) under the coldest supported temperature conditions. With reference for example to FIG. 2, when bringing up the VCO circuit 200, the coarse-tuning circuitry 214 may select one of the frequency bands 410 or 420 based on a reset value of the control voltage $V_{ctrl}$. As described above, the frequency band selection may affect the ability of the VCO to compensate for changes in frequency due to thermal drift. With reference for example to FIG. 4A, when the control voltage $V_{ctrl}$ is initialized to a reset voltage V0, the target frequency $f_{target}$ is right on the cusp of the lower frequency band 420 (e.g., at V0). Thus, in some aspects, the coarse-tuning circuitry 214 may select the lower frequency band 420 to coarse-tune the VCO circuit 200. Specifically, the coarse-tuning circuitry 214 may configure the VCO circuit 200 to operate in the lower frequency band 420 by coupling (or de-coupling) a number of capacitors (e.g., of the capacitor array) to the outputs outp and outn of the VCO circuit 200.

Because the VCO circuit 200 is brought up under cold temperature conditions, the VCO circuit 200 will initially produce an output signal at the target frequency (target (e.g., corresponding to the point along the frequency curve 422 while the control voltage is still held at the reset value V0) once coarse-tuning has been completed. However, after the coarse-tuning circuitry 214 has configured the VCO circuit 200 to operate in the selected frequency band 420, the VCO circuit 200 may release the control voltage $V_{ctrl}$ from the reset value V0. For example, the PLL (e.g., PLL 100 of FIG. 1) may assume control of the VCO circuit 200 by adjusting the control voltage $V_{ctrl}$ to maintain the output signal at the target frequency $f_{target}$.

As described above, the dynamic range of the PLL may be bounded by a minimum voltage threshold $V_{min}$ and a maximum voltage threshold $V_{max}$. For example, the PLL may be unable to lower the control voltage $V_{ctrl}$ below the minimum voltage threshold $V_{min}$ or increase the control voltage $V_{ctrl}$ above the maximum voltage threshold $V_{max}$. Thus, if the temperature of the VCO circuit 200 heats up beyond a certain temperature level, the PLL may be unable to maintain the output signal at the target frequency (target while operating in the current frequency band 420. For example, if the temperature of the VCO circuit 200 transitions from cold to hot, the control voltage $V_{ctrl}$ would need to be increased from the reset value V0 to a first voltage level V1 under the current frequency band 420 (e.g., from frequency curve 422 to frequency curve 424, as shown in FIG. 4A). However, because the PLL may be unable to adjust the control voltage $V_{ctrl}$ to the first voltage level V1 (since it is above the maximum voltage threshold $V_{max}$), the VCO circuit 200 may need to be reset (e.g., to switch to the higher frequency band 410). As described above, resetting the VCO circuit 200 may have undesirable consequences, such as causing the PLL to break lock.

Thus, in some embodiments, the VCO circuit 200 may determine the reset value for the control voltage $V_{ctrl}$ based, at least in part, on the temperature of the VCO circuit 200 and/or the PLL. For example, the VCO circuit 200 may receive temperature information via temperature sensors provided on the VCO circuit 200 and/or the PLL. In some aspects, the fine-tuning circuitry 220 may select a reset value at which the control voltage $V_{ctrl}$ is to be initialized based on the received temperature information. With reference for example to FIG. 4B, the fine-tuning circuitry 220 may select a "cold" reset value $V0_c$ when the VCO circuit 200 is brought up under cold temperature conditions. As shown in FIG. 4B, the cold reset value $V0_c$ is relatively low (e.g., lower than the reset value V0 depicted in FIG. 4A). When the control voltage $V_{ctrl}$ is initialized to the cold reset voltage $V0_c$, the target frequency $f_{target}$ is within the upper frequency band 410 (e.g., at V0c). Thus, in some aspects, the coarse-tuning circuitry 214 may select the upper frequency band 410 to coarse-tune the VCO circuit 200. Specifically, the coarse-tuning circuitry 214 may configure the VCO circuit 200 to operate in the upper frequency band 410 by coupling (or de-coupling) a number of capacitors (e.g., of the capacitor array) to the outputs outp and outn of the VCO circuit 200.

Because the VCO circuit 200 is brought up under cold temperature conditions, the VCO circuit 200 will initially produce an output signal at a frequency $f0_c$ (e.g., corresponding to the point along the frequency curve 412 while the control voltage is still held at the cold reset value V0c) once coarse-tuning has been completed. However, after the coarse-tuning circuitry 214 has configured the VCO circuit 200 to operate in the selected frequency band 410, the VCO circuit 200 may release the control voltage $V_{ctrl}$ from the reset value $V0_c$. For example, the PLL (e.g., PLL 100 of FIG. 1) may assume control of the VCO circuit 200 by adjusting the control voltage $V_{ctrl}$ until the frequency of the output signal reaches the target frequency $f_{target}$. In the example of FIG. 4B, the output signal reaches the target frequency (target when the control voltage $V_{ctrl}$ is reduced to a second voltage level V2.

It is noted that the second voltage level V2 is within the dynamic range of the PLL (e.g., $V_{min} < V2 < V_{max}$). Thus, the maximum dynamic range may be available for the PLL to adjust the control voltage $V_{ctrl}$ to compensate for temperature drift. For example, if the temperature of the VCO circuit 200 subsequently transitions from cold to hot, the control voltage $V_{ctrl}$ would need to be increased from the second voltage level V2 to a third voltage level V3 under the current frequency band 410 (e.g., from frequency curve 412 to frequency curve 414, as shown in FIG. 4B). In the example of FIG. 4B, the third voltage level V3 is still below the maximum voltage threshold $V_{max}$. Thus, the PLL may compensate for temperature variations across the entire range of supported temperatures without changing frequency bands and/or resetting the VCO circuit 200.

Figure 5:
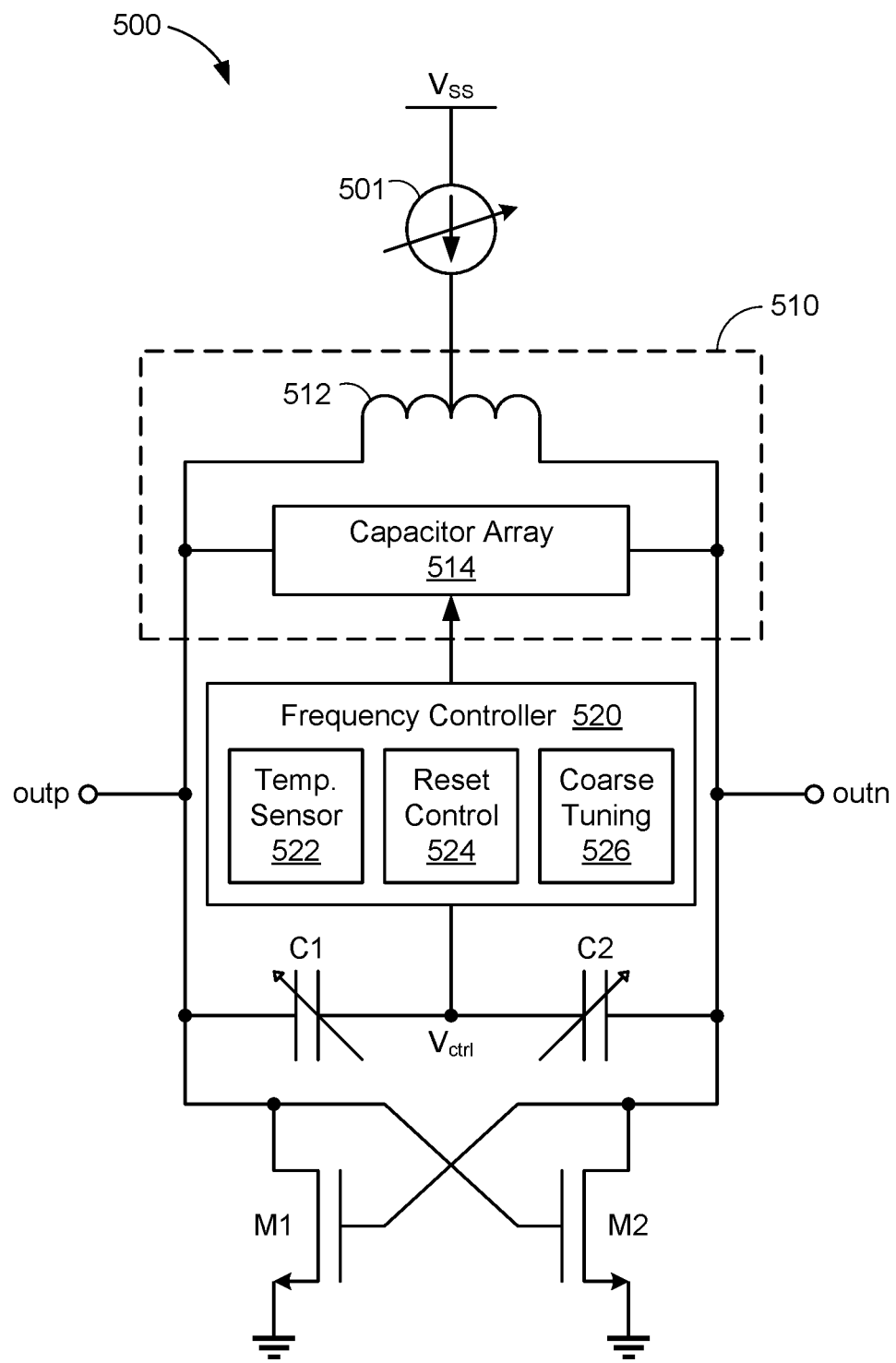
FIG. 5 is a block diagram of a temperature-dependent VCO circuit, in accordance with some embodiments.

FIG. 5 is a block diagram of a temperature-dependent VCO circuit 500, in accordance with some embodiments. The VCO circuit 500 may be an example embodiment of the VCO 110 of FIG. 1 and/or the VCO circuit 200 of FIG. 2. Thus, the VCO circuit 500 may be configured to produce an oscillating signal having a frequency of oscillation that is determined by a control voltage $V_{ctrl}$. In the example of FIG. 5, the oscillating signal may be output (e.g., as a differential signal) at a pair of output terminals (outp and outn) of the VCO circuit 500. In some embodiments, the VCO circuit 500 may include a current source 501, an inductor-capacitor (LC) tank 510, a frequency controller 520, and a set of varactors C1 and C2. In the example of FIG. 5, a pair of cross-coupled transistors M1 and M2 are also coupled to the outputs outp and outn of the VCO circuit 500 and provide a path to ground.

The LC tank 510 includes an inductor 512 and an array of capacitors 514. In the example of FIG. 5, the inductor 512 is coupled between the outputs outp and outn of the VCO circuit 500. The capacitor array 514 may include a plurality of capacitors (not shown for simplicity) that are switchably coupled to the outputs outp and outn of the VCO circuit 500. In some aspects, the plurality of capacitors may be arranged in rows and columns in the capacitor array 514. For example, each row of the array 514 may include a pair of capacitors switchably coupled between the outputs outp and outn of the VCO circuit 500. The number of capacitors (of the capacitor array 514) coupled to the outputs outp and outn of the VCO circuit 500 may determine the frequency band of the VCO circuit 500. Thus, the capacitor array 514 may be tuned (e.g., by the frequency controller 520) to one of a plurality of frequency bands by selectively coupling or decoupling one or more rows of capacitors to the outputs outp and outn of the VCO circuit 500.

The frequency of the output signal depends on the effective inductance (L) and the effective capacitance (C) of the VCO circuit 500 (e.g., between the outputs outp and outn). As described above, the LC tank 510 may produce an oscillating signal that can be coarsely tuned to have a frequency of oscillation in one of a plurality of frequency bands. However, once the frequency band has been set, the capacitance of the LC tank 510 may not be changed (e.g., without resetting the VCO circuit 500). Thus, any subsequent fine-tuning of the frequency of the output signal may be performed via the varactors C1 and C2. In the example of FIG. 5, the varactors C1 and C2 are coupled in series between the outputs outp and outn of the VCO circuit 500. A capacitance of the varactors C1 and C2 may be controlled by a control voltage $V_{ctrl}$. Thus, the control voltage $V_{ctrl}$ may be used to fine-tune the frequency of oscillation of the output signal to compensate for variations in temperature and/or other operating conditions of the VCO circuit 500.

The frequency controller 520 may configure the VCO circuit 500 (specifically, the LC tank 510) to operate in one of a plurality of frequency bands. In some embodiments, the frequency controller 520 may tune the LC tank 510 to a selected frequency band based, at least in part, on a temperature of the VCO circuit 500 and/or PLL. Thus, the frequency controller 520 may include a temperature sensor 522, a voltage reset controller 524, and coarse-tuning circuitry 526. The temperature sensor 522 may detect or measure a temperature of the VCO circuit 500 and/or the PLL on which the VCO circuit 500 operates. In some embodiments, the voltage reset controller 524 may configure the reset value of the control voltage $V_{ctrl}$ based, at least in part, on temperature information acquired by the temperature sensor 522. For example, as described above with respect to FIGS. 3A and 3B, the voltage reset controller 524 may select a relatively high reset value for the control voltage $V_{ctrl}$ when the VCO circuit 500 is brought up under hot temperature conditions. On the other hand, as described above with respect to FIGS. 4A and 4B, the voltage reset controller 524 may select a relatively low reset value for the control voltage $V_{ctrl}$ when the VCO circuit 500 is brought up under cold temperature conditions.

The coarse-tuning circuitry 526 may tune the VCO circuit 500 to operate in a particular frequency band based, at least in part, on the reset value of the control voltage $V_{ctrl}$. It is noted that, because the voltage reset controller 524 selects the reset value of the control voltage $V_{ctrl}$ based on the temperature of the VCO circuit 500 and/or the PLL, the frequency band selection may also depend on the temperature of the VCO circuit 500 and/or the PLL. For example, when bringing up the VCO circuit 500, the coarse-tuning circuitry 526 may select the frequency band that is closest to the target frequency of the output signal given the reset value of the control voltage $V_{ctrl}$ (e.g., as shown in FIGS. 3B and 4B). In some aspects, when the target frequency is between two frequency bands at the given reset value of the control voltage $V_{ctrl}$, the coarse-tuning circuitry 526 may select the higher of the two frequency bands (e.g., as shown in FIG. 3A). The coarse-tuning circuitry 526 may configure the VCO circuit 500 to operate in the selected frequency band by selectively coupling or de-coupling rows of capacitors in the capacitor array 514 to the outputs outp and outn of the VCO circuit 500.

As described above, changes in temperature of the VCO circuit 500 and/or the PLL may cause changes in the oscillation frequency of the output signal. By adjusting the reset value for the control voltage $V_{ctrl}$ based on the temperature of the VCO circuit 500, the coarse-tuning circuitry 526 may also select a frequency band for the VCO circuit 500 that is well-suited for current (and future) temperature conditions. For example, as shown in FIGS. 3B and 4B, the temperature-dependent frequency band selection may ensure that the maximum dynamic range of the PLL is available for adjusting the control voltage $V_{ctrl}$ to compensate for temperature drift. This may allow the PLL to compensate for a greater range of frequency variations caused by changes in operating temperature without resetting the VCO circuit 500 or causing the PLL to break lock.

Figure 6:
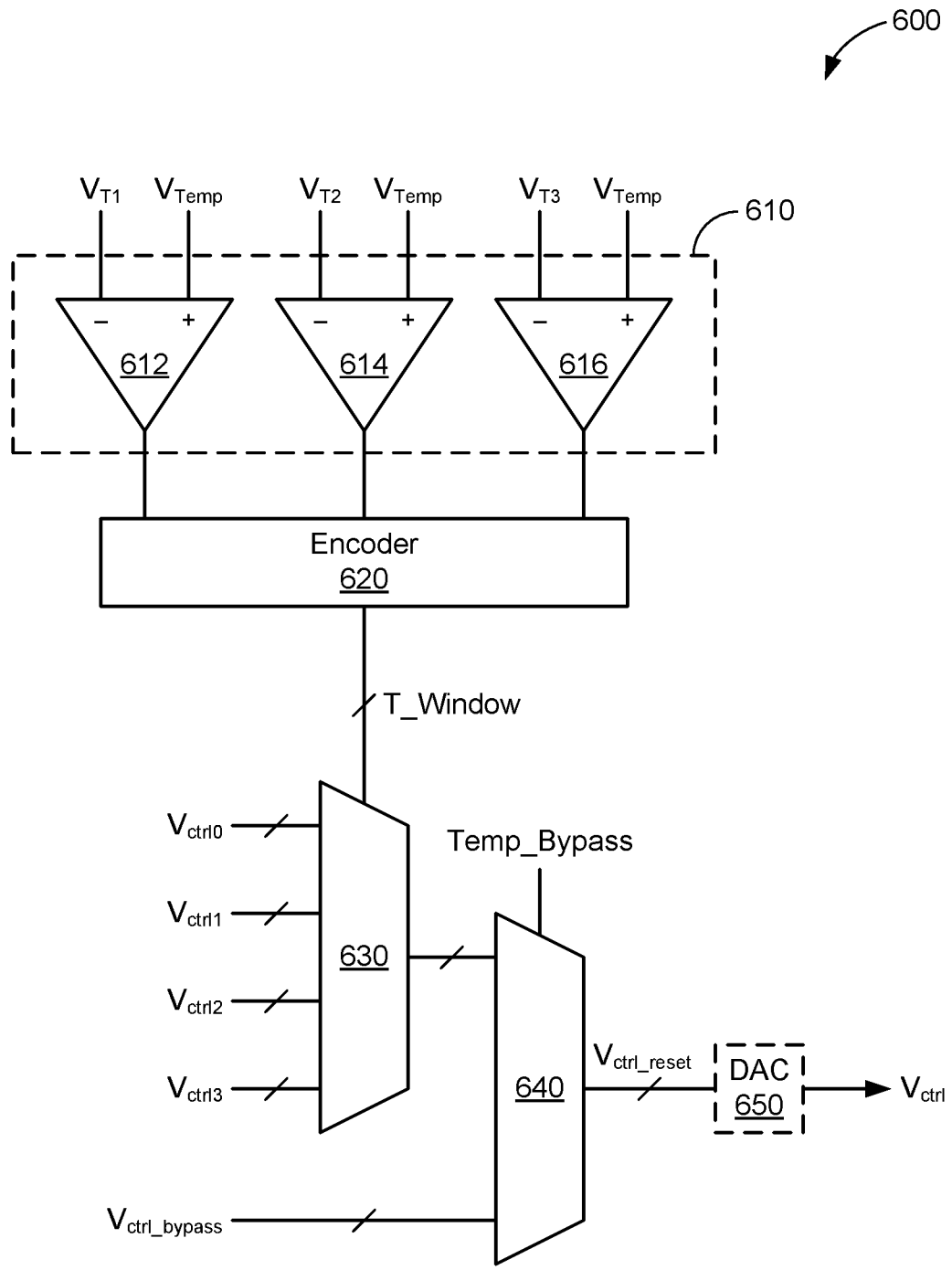
FIG. 6 is a block diagram of a temperature-dependent voltage reset controller, in accordance with some embodiments.

FIG. 6 is a block diagram of a temperature-dependent voltage reset controller 600, in accordance with some embodiments. The voltage reset controller 600 may be an example embodiment of the voltage reset controller 524 of FIG. 5. In some embodiments, the voltage reset controller 600 may be configured to select a reset value for the control voltage of a VCO (e.g., the VCO circuit 200 of FIG. 2 and/or the VCO circuit 500 of FIG. 5) based, at least in part, on the temperature of the VCO and/or a PLL in which the VCO operates. For example, the voltage reset controller 600 may receive temperature information $V_{Temp}$ from a temperature sensor (not shown for simplicity) provided on the VCO or the PLL and may generate a reset value $V_{ctrl\_reset}$ based, at least in part, on the received temperature information $V_{Temp}$.

The voltage reset controller 600 includes a comparator stage 610, an encoder 620, and multiplexers 630 and 640. The comparator stage 610 compares the received temperature information $V_{Temp}$ with a plurality of voltage thresholds $V_{T1}$-$V_{T3}$. For example, the comparator stage 610 may include a plurality of comparators 612-616 each configured to compare the temperature information $V_{Temp}$ with a respective one of the voltage thresholds $V_{T1}$-$V_{T3}$. For simplicity, only three voltage thresholds $V_{T1}$-$V_{T3}$ are depicted in the example of FIG. 6. However, in actual implementations, the comparator stage 610 may compare the temperature information $V_{Temp}$ with fewer or more voltage thresholds than those shown in FIG. 6.

The outputs of the comparators 612-616 indicate which of a plurality of temperature windows the temperature information $V_{Temp}$ resides in. For example, the output of the first comparator 612 may indicate whether the temperature information $V_{Temp}$ falls within a first temperature window (e.g., $V_{Temp} \leq V_{T1}$), the combined outputs of the first and second comparators 612 and 614 may indicate whether the temperature information $V_{Temp}$ falls within a second temperature window (e.g., $V_{T1} < V_{Temp} < V_{T2}$), the combined outputs of the second and third comparators 614 and 616 may indicate whether the temperature information $V_{Temp}$ falls within a third temperature window (e.g., $V_{T2} < V_{Temp} < V_{T3}$), and the output of the third comparator 616 may indicate whether the temperature information $V_{Temp}$ falls within a fourth temperature window (e.g., $V_{Temp} > V_{T3}$).

The outputs of the comparators 612-616 may be provided to the encoder 620. In some embodiments, the encoder 620 may generate a codeword T_Window representing the temperature window within which the temperature information $V_{Temp}$ resides. For example, the encoder 620 may output a codeword T_Window=111 if the temperature information $V_{Temp}$ falls within the first temperature window, the encoder 620 may output a codeword T_Window=011 if the temperature information $V_{Temp}$ falls within the second temperature window, the encoder 620 may output a codeword T_Window=001 if the temperature information $V_{Temp}$ falls within the third temperature window, and the encoder 620 may output a codeword T_Window=000 if the temperature information $V_{Temp}$ falls within the fourth temperature window.

In some embodiments, the codeword T_Window may be used to select one of a plurality of reset values $V_{ctrl0}$-$V_{ctrl3}$ for the control voltage. In the example of FIG. 6, the codeword T_Window may be provided as a selection signal to the multiplexer 630. More specifically, the multiplexer 630 may be coupled to receive, as inputs, each of the reset values $V_{ctrl0}$-$V_{ctrl3}$, and may selectively output one of the reset values $V_{ctrl1}$-$V_{ctrl3}$ based on the state of the codeword T_Window. For example, the multiplexer 630 may output the first reset value $V_{ctrl0}$ when the codeword T_Window indicates the first temperature window (e.g., T_Window=111), the multiplexer 630 may output the second reset value $V_{ctrl1}$ when the codeword T_Window indicates the second temperature window (e.g., T_Window=011), the multiplexer 630 may output the third reset value $V_{ctrl2}$ when the codeword T_Window indicates the third temperature window (e.g., T_Window=001), and the multiplexer 630 may output the fourth reset value $V_{ctrl3}$ when the codeword T_Window indicates the fourth temperature window (e.g., T_Window=000).

In some embodiments, the voltage reset controller 600 may provide an option to bypass or skip the temperature-dependent reset value selection. For example, the multiplexer 640 may selectively output a temperature-dependent reset value (e.g., $V_{ctrl0}$, $V_{ctrl1}$, $V_{ctrl2}$, or $V_{ctrl3}$) or a temperature-bypass reset value $V_{ctrl\_bypass}$ (e.g., which may be fixed regardless of temperature) as the reset value $V_{ctrl\_reset}$ for the VCO More specifically, the multiplexer 640 may receive, as inputs, the output of multiplexer 630 (e.g., corresponding to one of the reset values $V_{ctrl0}$-$V_{ctrl3}$) and a temperature-bypass reset value $V_{ctrl\_bypass}$, and may selectively output the selected temperature-dependent reset value (e.g., $V_{ctrl0}$, $V_{ctrl1}$, $V_{ctrl2}$, or $V_{ctrl3}$) or the temperature-bypass reset value $V_{ctrl\_bypass}$ based on the state of a bypass signal Temp_Bypass. For example, the multiplexer 640 may output the selected temperature-dependent reset value (e.g., $V_{ctrl0}$, $V_{ctrl1}$, $V_{ctrl2}$, or $V_{ctrl3}$) when the bypass signal is deasserted (e.g., Temp_Bypass=0) and may output the temperature-bypass reset value $V_{ctrl\_bypass}$ when the bypass signal is asserted (e.g., Temp_Bypass=1).

The voltage reset controller 600 may generate a new reset value $V_{ctrl\_reset}$ each time the VCO is reset (e.g., started or restarted) based on the temperature of the VCO and/or PLL at the time. However, once chosen, the reset value $V_{ctrl\_reset}$ may be held constant throughout the coarse-tuning operation (e.g., frequency band selection), and may not change until the next time the VCO is reset. In some embodiments, the reset value $V_{ctrl\_reset}$ may be encoded as a digital codeword. Thus, a digital-to-analog converter (DAC) 650 may convert the reset value $V_{ctrl\_reset}$ to the control voltage $V_{ctrl}$ used to adjust the frequency of the VCO.

Figure 7:
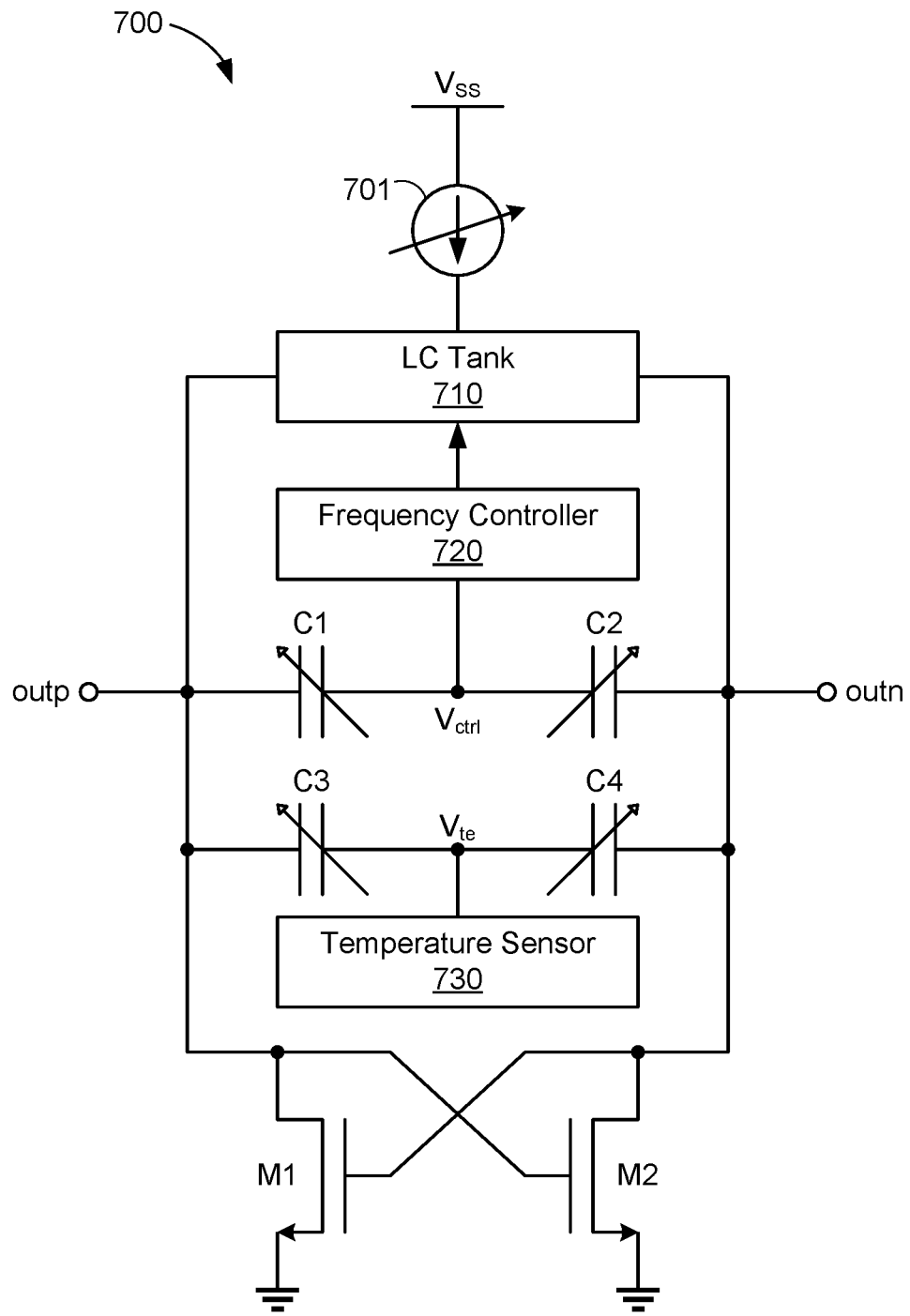
FIG. 7 is another block diagram of a temperature-dependent VCO circuit, in accordance with some embodiments.

FIG. 7 is another block diagram of a temperature-dependent VCO circuit 700, in accordance with some embodiments. The VCO circuit 700 may be an example embodiment of the VCO 110 of FIG. 1 and/or the VCO circuit 200 of FIG. 2. Thus, the VCO circuit 700 may be configured to produce an oscillating signal having a frequency of oscillation that is determined by a control voltage $V_{ctrl}$. In the example of FIG. 7, the oscillating signal may be output (e.g., as a differential signal) at a pair of output terminals (outp and outn) of the VCO circuit 700. In some embodiments, the VCO circuit 700 may include a current source 701, an inductor-capacitor (LC) tank 710, a frequency controller 720, and a first set of varactors C1 and C2, and a second set of varactors C3 and C4. In the example of FIG. 7, a pair of cross-coupled transistors M1 and M2 are also coupled to the outputs outp and outn of the VCO circuit 700 and provide a path to ground.

The LC tank 710 may be substantially similar to the LC tank 510 depicted in FIG. 5. For example, the LC tank 710 may include an inductor and an array of capacitors (not shown for simplicity). In the example of FIG. 7, the LC tank 710 is coupled between the outputs outp and outn of the VCO circuit 700 and may a plurality of capacitors that are switchably coupled to the outputs outp and outn of the VCO circuit 700. The number of capacitors (of the LC tank 710) coupled to the outputs outp and outn of the VCO circuit 700 may determine the frequency band of the VCO circuit 700. Thus, the LC tank 710 may be tuned (e.g., by the frequency controller 720) to one of a plurality of frequency bands by selectively coupling or decoupling one or more rows of capacitors to the outputs outp and outn of the VCO circuit 700.

The frequency of the output signal depends on the effective inductance (L) and the effective capacitance (C) of the VCO circuit 700 (e.g., between the outputs outp and outn). As described above, the LC tank 710 may produce an oscillating signal that can be coarsely tuned to have a frequency of oscillation in one of a plurality of frequency bands. Once the frequency band has been set, the capacitance of the LC tank 710 may not be changed (e.g., without resetting the VCO circuit 700). However, subsequent fine-tuning of the frequency of the output signal may be performed via the varactors C1 and C2. In the example of FIG. 7, the varactors C1 and C2 are coupled in series between the outputs outp and outn of the VCO circuit 700. A capacitance of the varactors C1 and C2 may be controlled by a control voltage $V_{ctrl}$. Thus, the control voltage $V_{ctrl}$ may be used to fine-tune the frequency of oscillation of the output signal to compensate for variations in temperature and/or other operating conditions of the VCO circuit 700.

The frequency controller 720 may configure the VCO circuit 700 (specifically, the LC tank 710) to operate in one of a plurality of frequency bands. In some embodiments, the frequency controller 720 may tune the LC tank 710 to a selected frequency band based, at least in part, on a temperature of the VCO circuit 700 and/or PLL. For example, in some aspects, the frequency controller 720 may detect or measure a temperature of the VCO circuit 700 and/or the PLL on which the VCO circuit 700 operates. The frequency controller 720 may further configure the reset value of the control voltage $V_{ctrl}$ based, at least in part, on measured temperature of the VCO circuit and/or PLL. For example, as described above with respect to FIGS. 3A and 3B, the frequency controller 720 may select a relatively high reset value for the control voltage $V_{ctrl}$ when the VCO circuit 700 is brought up under hot temperature conditions. On the other hand, as described above with respect to FIGS. 4A and 4B, the frequency controller 720 may select a relatively low reset value for the control voltage $V_{ctrl}$ when the VCO circuit 700 is brought up under cold temperature conditions.

In some embodiments, the frequency controller 720 may also tune the VCO circuit 700 to operate in a particular frequency band based, at least in part, on the reset value of the control voltage $V_{ctrl}$. For example, when bringing up the VCO circuit 700, the frequency controller 720 may select the frequency band that is closest to the target frequency of the output signal given the reset value of the control voltage $V_{ctrl}$ (e.g., as shown in FIGS. 3B and 4B). In some aspects, when the target frequency is between two frequency bands at the given reset value of the control voltage $V_{ctrl}$, the frequency controller 720 may select the higher of the two frequency bands (e.g., as shown in FIG. 3A). The frequency controller 720 may configure the VCO circuit 700 to operate in the selected frequency band by selectively coupling or de-coupling rows of capacitors in the LC tank 710 to the outputs outp and outn of the VCO circuit 700.

As described above, changes in temperature of the VCO circuit 700 and/or the PLL may cause changes in the oscillation frequency of the output signal. By adjusting the reset value for the control voltage $V_{ctrl}$ based on the temperature of the VCO circuit 700, the frequency controller 720 may also select a frequency band for the VCO circuit 700 that is well-suited for current (and future) temperature conditions. For example, as shown in FIGS. 3B and 4B, the temperature-dependent frequency band selection may ensure that the maximum dynamic range of the PLL is available for adjusting the control voltage $V_{ctrl}$ to compensate for temperature drift. This may allow the PLL to compensate for a greater range of frequency variations caused by changes in operating temperature without resetting the VCO circuit 700 or causing the PLL to break lock.

It is noted, however, that the adjustment of the control voltage $V_{ctrl}$ may be limited by the dynamic range of the PLL. Thus, it may be desirable to reduce the dependency on the control voltage $V_{ctrl}$ to compensate for temperature drift. In some embodiments, the second set of varactors C3 and C4 may be provided to further compensate for frequency variation in the VCO circuit 700. More specifically, the second set of varactors C3 and C4 may further fine-tune the frequency of oscillation of the output signal in response to variations in temperature of the VCO circuit 700 (e.g., to supplement the fine-tuning of the first set of varactors C1 and C2). However, the capacitance of the second set of varactors C3 and C4 may be tuned by a temperature sensor 730 (e.g., rather than the control voltage $V_{ctrl}$ which controls the first set of varactors C3 and C4). In some embodiments, the temperature sensor 730 may generate a temperature-dependent voltage $V_{te}$ that directly controls the capacitance of the second set of varactors C3 and C4.

Figure 8:
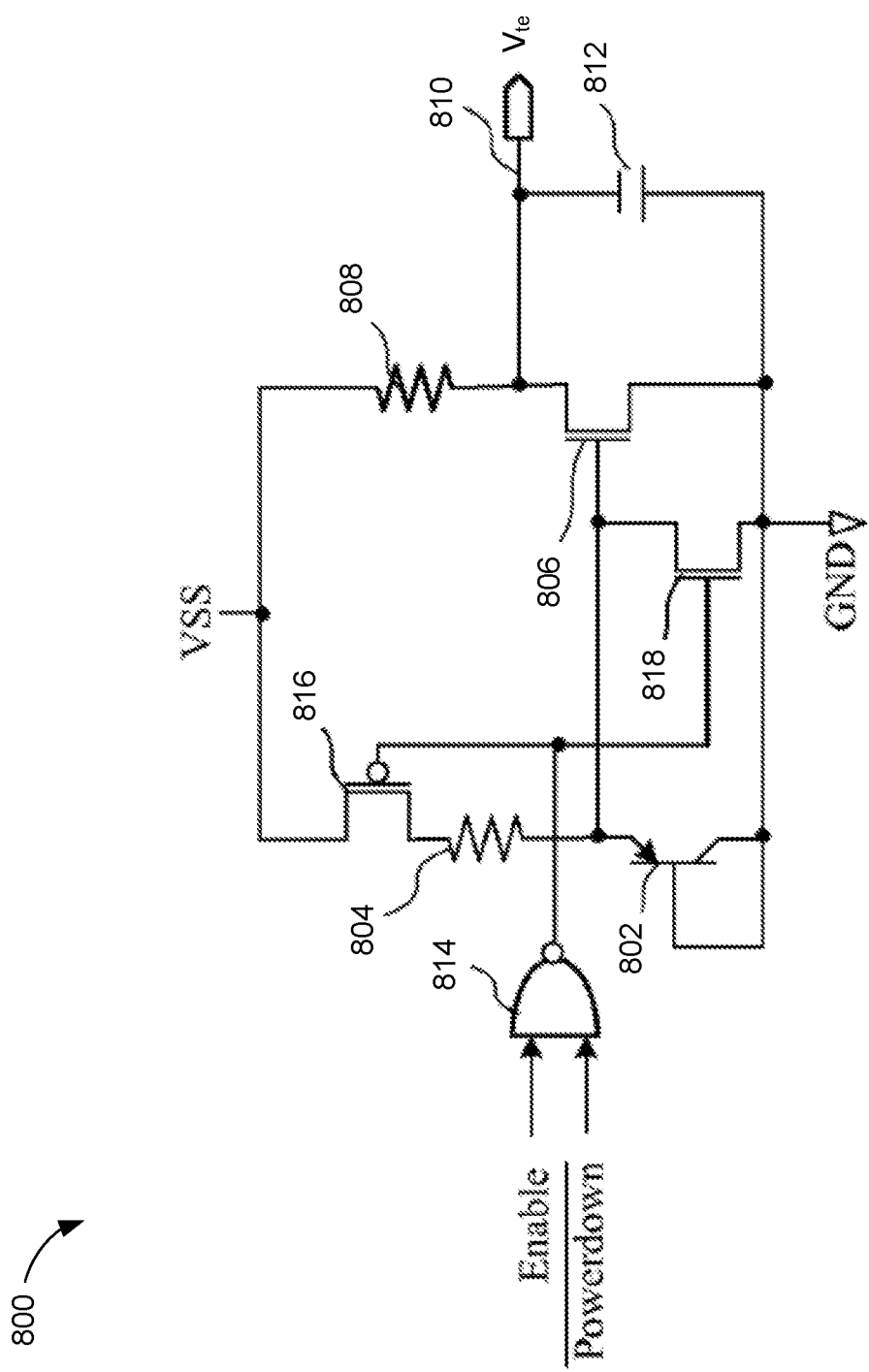
FIG. 8 is a circuit diagram of a temperature sensor, in accordance with some embodiments.

FIG. 8 is a circuit diagram of a temperature sensor 800, in accordance with some embodiments. The temperature sensor 800 may be an example embodiment of the temperature sensor 730 of FIG. 7. Thus, the temperature sensor 800 may be configured to generate a temperature-dependent voltage $V_{te}$ that varies with respect to a temperature of a corresponding VCO circuit (such as the VCO circuit 700 of FIG. 7). The temperatures sensor 800 includes a bipolar junction transistor (BJT) 802, resistors 404 and 408, a p-type metal-oxide-semiconductor (PMOS) transistor 416, n-type metal-oxide-semiconductor (NMOS) transistors 406 and 418, a NAND logic gate 814, and a capacitor 812 coupled to an output of the temperature sensor 800.

The emitter of the BJT 802 is coupled to the resistor 804, while the base and collector of the BJT 802 are coupled to ground. The gate of the NMOS transistor 806 is coupled to the emitter of the BJT 802, the drain of the NMOS 806 is coupled to the resistor 808, and the source of the NMOS 806 is coupled to ground. The NMOS transistor 806 may amplify the voltage at the emitter of the BJT 802 to produce the temperature-dependent voltage $V_{te}$ at the output of the temperature sensor 800. The NAND gate 814 may receive control signals (e.g., Enable and $\overline{\text{Powerdown}}$), and may selectively turn on/off the PMOS transistor 816 or NMOS transistor 818 based on a logical combination of the received control signals. For example, if the temperature sensor 800 is disabled (e.g., Enable=0) or is in a power-down mode (e.g., $\overline{\text{Powerdown}}$=0), the NAND gate 814 may turn off the PMOS transistor 816 and turn on the NMOS transistor 818. It is noted that, turning on the NMOS transistor 818 also turns off the NMOS transistor 806, for example, to reduce leakage current.

The temperature sensor 800 may use the BJT 802 to sense thermal variation and produce a temperature-dependent voltage $V_{te}$ at its output (e.g., across the capacitor 812). For example, the base-emitter voltage ($V_{be}$) of the BJT 802 may linearly decrease with increases in temperature, driving the temperature sensor 800 to produce the temperature-dependent voltage $V_{te}$ at the output of the temperature sensor 800.

With reference for example to FIG. 7, the temperature-dependent voltage $V_{te}$ may be used to control the second set of varactors C3 and C4 to compensate for frequency drift due to temperature variations in the VCO circuit 700. For example, the VCO circuit 700 may produce a higher frequency of oscillation when operated in colder temperature conditions and may produce a lower frequency of oscillation when operated in hotter temperature conditions. Thus, the temperature sensor 800 may increase the capacitance of the varactors C3 and C4 to compensate for reductions in the temperature of the VCO circuit 700 and may decrease the capacitance of the varactors C3 and C4 to compensate for increases in the temperature of the VCO circuit 700.

Figure 9:
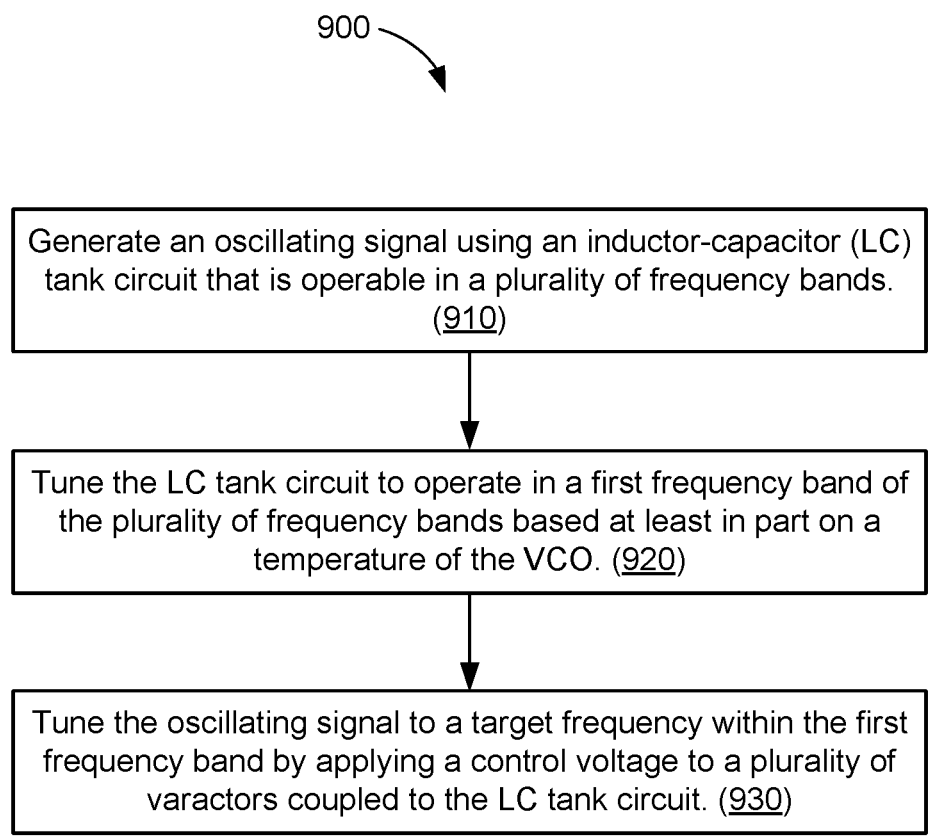
FIG. 9 is an illustrative flow chart depicting an example operation of a temperature-dependent VCO, in accordance with some embodiments.

FIG. 9 is an illustrative flow chart depicting an example operation 900 of a temperature-dependent VCO, in accordance with some embodiments. With reference for example to FIG. 2, the example operation 900 may be performed by the VCO circuit 200 to produce an output signal at a target frequency while compensating for frequency variations due to thermal drift. More specifically, the example operation 900 may allow the VCO circuit 200 to compensate for thermal drift without having to be reset and/or switch to a new frequency band after starting up.

The VCO circuit 200 may generate an oscillating signal using an inductor-capacitor (LC) tank circuit that is operable in a plurality of frequency bands (910). The frequency of the output signal depends on the effective inductance (L) and the effective capacitance (C) of the VCO circuit 200 (e.g., between the outputs outp and outn). With reference for example to FIG. 2, the LC tank circuit 210 may include an inductor 212 and coarse-tuning circuitry 214. The coarse-tuning circuitry 214 may include a plurality of capacitors (not shown for simplicity) that are switchably coupled to the outputs outp and outn of the VCO circuit 200. The number of capacitors (of the coarse-tuning circuitry 214) coupled to the outputs outp and outn of the VCO circuit 200 may determine the frequency band of the VCO circuit 200. Thus, the coarse-tuning circuitry 214 may tune the VCO circuit 200 to operate in one of a plurality of frequency bands by selectively coupling or decoupling one or more rows of capacitors to the outputs outp and outn of the VCO circuit 200.

The VCO circuit 200 may further tune the LC tank circuit to operate in a first frequency band of the plurality of frequency bands based at least in part on a temperature of the VCO (920). Aspects of the present disclosure recognize that the selection of a frequency band for the VCO circuit 200 may depend on the reset value of the control voltage $V_{ctrl}$. For example, when bringing up the VCO circuit 200, the coarse-tuning circuitry 214 may select the frequency band that is closest to the target frequency of the output signal given the reset value of the control voltage $V_{ctrl}$. In some aspects, when the target frequency is between two frequency bands, the coarse-tuning circuitry 214 may select the higher of the two frequency bands (e.g., producing higher frequencies of oscillation at any control voltage $V_{ctrl}$).

In some embodiments, the fine-tuning circuitry 220 may select a reset value for the control voltage $V_{ctrl}$ based, at least in part, on the temperature of the VCO circuit 200 and/or the PLL in which the VCO circuit 200 operates. For example, the fine-tuning circuitry 220 may select a higher (or lower) reset value for the control voltage $V_{ctrl}$ when the VCO circuit 200 is brought up (e.g., started or restarted) in hotter temperatures, and may select a lower (or higher) reset value for the control voltage $V_{ctrl}$ when the VCO circuit 200 is brought up in colder temperatures. By adjusting the reset value for the control voltage $V_{ctrl}$ based on the temperature of the VCO circuit 200, the coarse-tuning circuitry 214 may also select a frequency band (e.g., by coupling or decoupling capacitors between the outputs outp and outn) for the VCO circuit 200 that is well-suited for current (and future) temperature conditions The VCO circuit 200 may then tune the oscillating signal to a target frequency within the first frequency band by applying a control voltage to a plurality of varactors coupled to the LC tank circuit (930). For example, once the LC tank 210 has been configured to operate in a selected frequency band (e.g., using the coarse-tuning circuitry 214), the frequency of the output signal may be tuned (e.g., within a range of frequencies associated with the selected frequency band) using the fine-tuning circuitry 220. In some embodiments, the fine-tuning circuitry 220 may include one or more varactors coupled (e.g., in series) between the outputs outp and outn of the VCO circuit 200. A capacitance of at least some of the varactors may be controlled by a control voltage $V_{ctrl}$. Thus, the control voltage $V_{ctrl}$ may be used to fine-tune the frequency of oscillation of the output signal to compensate for variations in temperature and/or other operating conditions of the VCO circuit 200.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A voltage-controlled oscillator (VCO) circuit, comprising:
   an inductor-capacitor (LC) tank circuit configured to produce an oscillating signal, wherein the LC tank circuit is operable in a plurality of frequency bands;
   tuning circuitry configured to tune the LC tank circuit to operate in a first frequency band of the plurality of frequency bands based at least in part on a temperature of the VCO circuit; and
   a plurality of first varactors, coupled to the LC tank circuit, for tuning the oscillating signal to a target frequency within the first frequency band based on a control voltage.

2. The VCO circuit of claim 1, wherein the LC tank circuit comprises:
   an inductor coupled between a first output of the VCO circuit and a second output of the VCO circuit; and
   a number of capacitors switchably coupled between the first and second outputs of the VCO circuit, wherein the number of capacitors coupled between the first and second outputs determines in which of the plurality of frequency bands the LC tank is configured to operate.

3. The VCO circuit of claim 1, wherein the tuning circuitry comprises:
   a temperature sensor to measure the temperature of the VCO circuit;
   a voltage reset controller to select a reset value for the control voltage based on the temperature of the VCO circuit, wherein the control voltage is initialized to the reset value when starting or restarting the VCO circuit; and
   coarse-tuning circuitry to select the first frequency band based at least in part on the reset value of the control voltage and the target frequency of the oscillating signal.

4. The VCO circuit of claim 3, wherein the voltage reset controller comprises:
   a temperature comparator to compare the temperature of the VCO circuit with a plurality of temperature thresholds and select one of a plurality of temperature windows based on the comparison; and
   a codeword generator to select one of a plurality of voltage codewords based on the selected temperature window, wherein the selected voltage codeword corresponds to the reset value for the control voltage.

5. The VCO circuit of claim 4, further comprising:
   a digital-to-analog converter (DAC) to convert the selected voltage codeword to the control voltage.

6. The VCO circuit of claim 3, wherein a frequency of the oscillating signal is different than the target frequency when the LC tank circuit operates in the first frequency band and the control voltage is at the reset value.

7. The VCO circuit of claim 6, further comprising:
   fine-tuning circuitry configured to tune the oscillating signal to the target frequency by increasing or decreasing the control voltage from the reset value.

8. The VCO circuit of claim 1, further comprising:
   a plurality of second varactors, coupled to the LC tank circuit, for adjusting a frequency of the oscillating signal in response to changes in the temperature of the VCO circuit.

9. A method of operating a voltage-controlled oscillator (VCO), comprising:
   generating an oscillating signal using an inductor-capacitor (LC) tank circuit, wherein the LC tank circuit is operable in a plurality of frequency bands;
   tuning the LC tank circuit to operate in a first frequency band of the plurality of frequency bands based at least in part on a temperature of the VCO circuit;
   tuning the oscillating signal to a target frequency within the first frequency band by applying a control voltage to a plurality of first varactors coupled to the LC tank circuit.

10. The method of claim 9, wherein tuning the LC tank circuit comprises:
    measuring a temperature of the VCO circuit;
    selecting a reset value for the control voltage based on the temperature of the VCO circuit, wherein the control voltage is initialized to the reset value when starting or restarting the VCO circuit; and
    selecting the first frequency band based at least in part on the reset value of the control voltage and the target frequency of the oscillating signal.

11. The method of claim 10, wherein selecting the reset value comprises:
    comparing the temperature of the VCO circuit with a plurality of temperature thresholds;
    selecting one of a plurality of temperature windows based on the comparison;
    selecting one of a plurality of voltage codewords based on the selected temperature window; and
    converting the selected voltage codeword to the control voltage.

12. The method of claim 10, wherein a frequency of the oscillating signal is different than the target frequency when the LC tank circuit operates in the first frequency band and the control voltage is at the reset value, and wherein the oscillating signal is tuned to the target frequency by increasing or decreasing the control voltage from the reset value.

13. The method of claim 9, further comprising:
    adjusting a frequency of the oscillating signal, using a plurality of second varactors, in response to changes in the temperature of the VCO circuit.

14. A voltage-controlled oscillator (VCO) circuit, comprising:
    an inductor-capacitor (LC) tank circuit configured to produce an oscillating signal, wherein the LC tank circuit is operable in a plurality of frequency bands;
    a plurality of first varactors, coupled to the LC tank circuit, for tuning the oscillating signal to a target frequency based on a control voltage; and
    tuning circuitry configured to select a reset value for the control voltage based on a temperature of the VCO circuit, wherein the control voltage is initialized to the reset value when starting or restarting the VCO circuit.

15. The VCO circuit of claim 14, further comprising:
    a temperature sensor to measure the temperature of the VCO circuit; and
    coarse-tuning circuitry to tune the LC tank circuit to operate in a first frequency band of the plurality of frequency bands based at least in part on the reset value of the control voltage and the target frequency of the oscillating signal.

16. The VCO circuit of claim 15, wherein a frequency of the oscillating signal is different than the target frequency when the LC tank circuit operates in the first frequency band and the control voltage is at the reset value.

17. The VCO circuit of claim 16, further comprising:
    fine-tuning circuitry configured to tune the oscillating signal to the target frequency by increasing or decreasing the control voltage from the reset value.

18. The VCO circuit of claim 14, wherein the tuning circuitry comprises:

a temperature comparator to compare the temperature of the VCO circuit with a plurality of temperature thresholds and select one of a plurality of temperature windows based on the comparison; and a codeword generator to select one of a plurality of voltage codewords based on the selected temperature window, wherein the selected voltage codeword corresponds to the reset value for the control voltage.

19. The VCO circuit of claim 18, further comprising:

a digital-to-analog converter (DAC) to convert the selected voltage codeword to the control voltage.

20. The VCO circuit of claim 14, further comprising:

a plurality of second varactors, coupled to the LC tank circuit, for adjusting a frequency of the oscillating signal in response to changes in the temperature of the VCO circuit.

\* \* \* \* \*